(12) United States Patent
Zhao et al.

(10) Patent No.: US 10,910,029 B2
(45) Date of Patent: Feb. 2, 2021

(54) COMPLEMENTARY MAGNETIC MEMORY CELL

(71) Applicant: BEIHANG UNIVERSITY, Beijing (CN)

(72) Inventors: Weisheng Zhao, Beijing (CN); Zhaohao Wang, Beijing (CN); Erya Deng, Beijing (CN)

(73) Assignee: BEIHANG UNIVERSITY, BeiJing (CN)

( * ) Notice: Subject to any disclaimer, the term of this patent is extended or adjusted under 35 U.S.C. 154(b) by 0 days.

(21) Appl. No.: 16/162,174

(22) Filed: Oct. 16, 2018

(65) Prior Publication Data
US 2019/0051339 A1 Feb. 14, 2019

(30) Foreign Application Priority Data
Aug. 9, 2018 (CN) .......................... 2018 1 0901797

(51) Int. Cl.
*G11C 11/16* (2006.01)
*G11C 11/22* (2006.01)
*G11C 11/18* (2006.01)

(52) U.S. Cl.
CPC ........ *G11C 11/1673* (2013.01); *G11C 11/161* (2013.01); *G11C 11/1659* (2013.01); *G11C 11/1675* (2013.01); *G11C 11/18* (2013.01); *G11C 11/2275* (2013.01); *G11C 11/1693* (2013.01)

(58) Field of Classification Search
CPC .......................... G11C 11/1673; G11C 11/161
See application file for complete search history.

(56) References Cited

U.S. PATENT DOCUMENTS

| | | | |
|---|---|---|---|
| 8,988,923 B2* | 3/2015 | Khalili Amiri | G11C 11/161 365/145 |
| 2010/0188895 A1* | 7/2010 | Lou | G11C 11/1675 365/171 |
| 2012/0069629 A1* | 3/2012 | Ueda | G11C 11/1659 365/148 |
| 2018/0261763 A1* | 9/2018 | Annunziata | H01L 43/12 |
| 2019/0051815 A1* | 2/2019 | Kakinuma | H01L 43/06 |
| 2019/0115060 A1* | 4/2019 | Deshpande | H01L 43/02 |

* cited by examiner

*Primary Examiner* — Muna A Techane (57) ABSTRACT

A complementary magnetic memory cell includes: a heavy metal film or an antiferromagnetic film, a first magnetic tunnel junction, a second magnetic tunnel junction, a first electrode, a second electrode, a third electrode, a fourth electrode, and a fifth electrode; wherein the first magnetic tunnel junction and the second magnetic tunnel junction are fabricated above the heavy metal film or the antiferromagnetic film; the first electrode, the second electrode and the third electrode are fabricated under the heavy metal film or the antiferromagnetic film; the fourth electrode is fabricated above the first magnetic tunnel junction, and the fifth electrode is fabricated above the second magnetic tunnel junction; to store one bit of data, the first magnetic tunnel junction and the second magnetic tunnel junction are arranged in a pair of complementary resistance states, wherein one magnetic tunnel junction is set to a high resistance state and the other remains unchanged.

3 Claims, 11 Drawing Sheets

Fig. 11

COMPLEMENTARY MAGNETIC MEMORY CELL

CROSS REFERENCE OF RELATED APPLICATION

The present invention claims priority under 35 U.S.C. 119(a-d) to CN 201810901797.0, filed Aug. 9, 2018.

BACKGROUND OF THE PRESENT INVENTION

Field of Invention

The present invention relates to a complementary magnetic memory cell, which uses a pair of magnetic tunnel junctions with complementary states to store data, belonging to a field of non-volatile storage and logic technology.

Description of Related Arts

As the feature size of the semiconductor process continues to decrease, the static power consumption caused by the transistor leakage current is increasing in the total power consumption of the integrated circuit, causing serious energy waste. Emerging non-volatile memory can save data in the power-off state, which is one of the effective solutions to solve the static power consumption problem of integrated circuits. Among them, a magnetic random access memory (MRAM) based on a magnetic tunnel junction is expected to become a next-generation universal non-volatile memory because of its advantages of high speed, low power consumption, and infinite endurance.

In the development of MRAM, the progress of data writing technology is the leading factor driving its performance optimization. Early MRAM used magnetic fields to achieve data writing, and the required write current was higher. The more serious problem is that as the device size decreases, the current required for the magnetic field writing technology cannot be reduced, which prohibits development of MRAM with large capacity and low power consumption. To overcome this drawback, spin transfer torque (STT) technology has been proposed and applied to write operations of MRAM. In order to generate the spin transfer torque, it is only necessary to apply current to the memory cell device (ie, the magnetic tunnel junction) of the MRAM, and the current can be correspondingly reduced as the device size decreases, contributing to MRAM with large capacity and low power consumption. However, the write current of the STT-MRAM directly passes through the ultra-thin barrier layer of the magnetic tunnel junction, which easily causes breakdown and failure of the device, and the power consumption required and delay when writing from the low resistance state to the high resistance state are larger than those of another write case (hereinafter referred to as the write asymmetry problem of spin transfer torque), which is not conducive to the design and optimization of the MRAM circuit. Recently proposed spin orbit torque (SOT) technology also implements data writing of MRAM through current. This current does not need to flow through the magnetic tunnel junction, so that the read/write paths are separated from each other, reducing the risk of barrier breakdown. It is conducive to independently optimize the read and write performance, and for the magnetic tunnel junction with perpendicular magnetic anisotropy, the spin orbit torque can achieve sub-nanosecond ultra-fast write speed. However, the SOT-MRAM memory cell has three terminals and typically requires two access transistors, causing additional area overhead. In addition, the ratio of the high and low resistance values of the memory cell is small, which tends to cause an increase in the read error rate.

SUMMARY OF THE PRESENT INVENTION

An object of the present invention is to provide a complementary magnetic memory cell, wherein in view of the drawbacks faced by the conventional MRAM mentioned in the above background, especially the write asymmetry problem of STT-MRAM, the additional area overhead and high read error rate of SOT-MRAM, the present invention adopts a pair of magnetic tunnel junctions with complementary states to store data, reducing read error rates; the device structure and write mechanism are optimized, solving the above-mentioned write asymmetry problem and additional area overhead.

Accordingly, in order to accomplish the above objects, the present invention provides a complementary magnetic memory cell, comprising: a heavy metal film or an antiferromagnetic film, a first magnetic tunnel junction, a second magnetic tunnel junction, a first electrode, a second electrode, a third electrode, a fourth electrode, and a fifth electrode; wherein the first magnetic tunnel junction and the second magnetic tunnel junction are fabricated above the heavy metal film or the antiferromagnetic film; the first electrode, the second electrode and the third electrode are fabricated under the heavy metal film or the antiferromagnetic film; the fourth electrode is fabricated above the first magnetic tunnel junction, and the fifth electrode is fabricated above the second magnetic tunnel junction; to store one bit of data, the first magnetic tunnel junction and the second magnetic tunnel junction are arranged in a pair of complementary resistance states, wherein one of the first magnetic tunnel junction and the second magnetic tunnel junction is set to a high resistance state and the other is set to a low resistance state.

The first magnetic tunnel junction and the second magnetic tunnel junction are each formed by four layers, comprising a first ferromagnetic metal, a first oxide, a second ferromagnetic metal, and a first synthetic antiferromagnetic layer.

Both the first magnetic tunnel junction and the second magnetic tunnel junction have at least two resistance states, and resistance values thereof depend on magnetization directions of a first ferromagnetic metal and a second ferromagnetic metal.

A magnetic tunnel junction quantity is expandable, so as to expand a data capacity, when the magnetic tunnel junction quantity is 2X and X is a positive integer, the complementary magnetic memory cell is capable of storing X bits of data.

The present invention also provides a data writing method of a complementary magnetic memory cell based on a spin orbit torque and a spin transfer torque, wherein the spin orbit torque is generated by applying a current to a heavy metal film or an antiferromagnetic film, and the spin transfer torque is generated by applying a current to a magnetic tunnel junction; the data writing method comprises steps of: step 1) applying a sufficient current to the heavy metal film or the antiferromagnetic film for generating the spin orbit torque, so as to set two magnetic tunnel junctions to a high resistance state; and a step 2) applying a sufficient current to one of the two magnetic tunnel junctions for generating the spin transfer torque, so as to set the magnetic tunnel junction with the spin transfer torque to a low resistance state while the other magnetic tunnel junction remains in the high resistance state.

According to the data writing method, a current required for data writing is unidirectional.

The present invention also provides a reading method of a complementary magnetic memory cell, comprising a step of comparing resistance values of two magnetic tunnel junctions.

The present invention discloses the complementary magnetic memory cell that has the following advantages over standard STT-MRAM and SOT-MRAM memory cells:

The present invention manufactures a plurality of magnetic tunnel junctions on the same heavy metal film or antiferromagnetic film, and reduces the number of access transistors compared with spin orbit torque magnetic memory cells adopting a three-terminal magnetic tunnel junction, which is conducive to integration.

The write operation of the complementary magnetic memory cell of the present invention requires a unidirectional current, so the access transistor does not suffer from source degeneration. However, in the conventional STT-MRAM or SOT-MRAM, the current required for write operation is bidirectional, and the access transistors suffer from severe source degeneration.

During the write operation of the complementary magnetic memory cell of the present invention, the spin transfer torque is only responsible for writing the magnetic tunnel junction from the high resistance state to the low resistance state, thereby avoiding excessive power consumption and excessive delay caused by write asymmetry problem in the conventional STT-MRAM.

The reading operation of the complementary magnetic memory cell of the present invention is realized by comparing the complementary resistance values of a pair of magnetic tunnel junctions, wherein tunneling magnetoresistance ratio of the magnetic tunnel junction is not degraded, and read sensing margin is relatively large and conducive to reducing the read error rate.

These and other objectives, features, and advantages of the present invention will become apparent from the following detailed description, the accompanying drawings, and the appended claims.

ELEMENT REFERENCE

1—heavy metal film or antiferromagnetic film
2—first electrode
3—second electrode
4—third electrode
5A-5N—first ferromagnetic metal
6A-6N—first oxide
7A-7N—second ferromagnetic metal
8A-8N—first synthetic antiferromagnetic layer
9—fourth electrode
10—fifth electrode
11—first magnetic tunnel junction
12—second magnetic tunnel junction
13—read circuit module
14—enable control terminal of the read circuit module
15—output terminal of the read circuit module
16—sixth electrode
17—seventh electrode
18—third magnetic tunnel junction
19—fourth magnetic tunnel junction
20—eighth electrode
21—ninth electrode
22—fifth magnetic tunnel junction
23—sixth magnetic tunnel junction
24-26—pair of magnetic tunnel junctions set to complementary resistance states
W1—write current flowing from the first electrode to the third electrode
W2—write current flowing from the first electrode to the fourth electrode
W3—write current flowing from the third electrode to the fifth electrode
W4—write current flowing from the third electrode to the fourth electrode
W5—write current flowing from the first electrode to the fifth electrode
W6—write current flowing from the third electrode to the first electrode
W7—write current from the third electrode to the seventh electrode
R1—read current flows through the first magnetic tunnel junction and the second electrode
R2—read current flows through the second magnetic tunnel junction and the second electrode R3—read current flows through the third magnetic tunnel junction and the second electrode
R4—read current flows through the fourth magnetic tunnel junction and the second electrode
$I_{W1}$—value of the write current W1
$I_{W2}$—value of the write current W2
$I_{L\_H}$—minimum write current value required to switch the magnetic tunnel junction from a low resistance state to a high resistance state using a spin orbit torque
$I_{H\_L}$—minimum write current value required to switch the magnetic tunnel junction from a high resistance state to a low resistance state using a spin transfer torque
$R_{11}$—resistance value of the first magnetic tunnel junction
$R_{12}$—resistance value of the second magnetic tunnel junction
$R_H$—resistance value of a magnetic tunnel junction in a high resistance state
$R_L$—resistance value of a magnetic tunnel junction in a low resistance state
$D_{L\_H}$—write delay of a magnetic tunnel junction switched from a low resistance state to a high resistance state
$D_{H\_L}$—write delay of a magnetic tunnel junction switched from a high resistance state to a low resistance state
t—time
$t_i$—corresponding moment, wherein i=1, 2, ... 10
$V_{14}$—voltage signal value of the enable control terminal of the read circuit module
$V_{15}$—voltage signal value at the output terminal of the read circuit module
$I_{R1}$—value of the read current R1
$I_{R2}$—value of the read current R2
$I_C$—minimum current value required to switch a magnetic tunnel junction resistance state.
$V_H$—logic high value of a digital signal
$V_L$—logic low value of a digital signal

DETAILED DESCRIPTION OF THE PREFERRED EMBODIMENT

The substantial features of the present invention are further described with reference to the drawings. The figures are schematic representations in which the thickness of each functional layer or region involved is not the actual size, and the resistance, current and voltage values in the operating mode are also not actual values.

Detailed exemplary embodiments are disclosed herein, and the specific structural details and functional details are only for the purpose of describing. Embodiments have been shown and described for the purposes of illustrating the functional and structural principles of the present invention and is subject to change without departure from such principles. Therefore, this invention includes all modifications encompassed within the spirit and scope of claims.

The present invention provides a complementary magnetic memory cell which can be used for constructing a magnetic random access memory as well as for designing a magnetic logic circuit.

Figure 1:
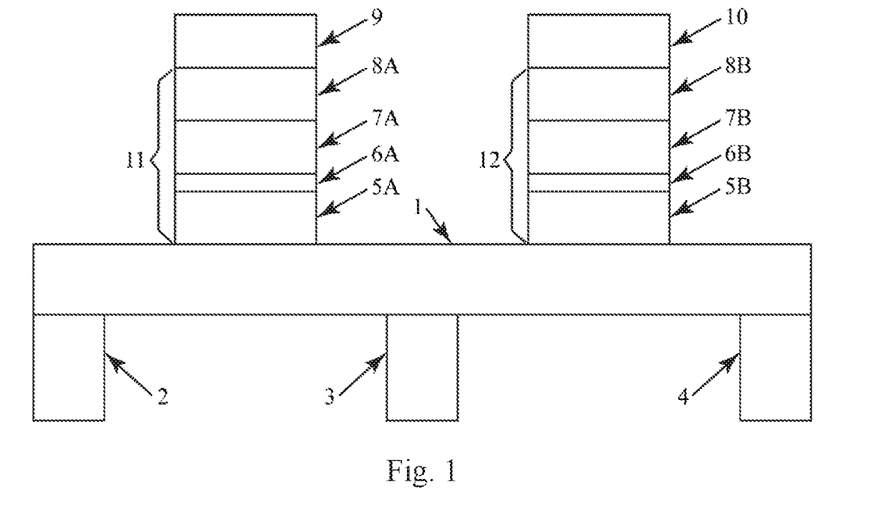
FIG. 1 is a structural view of a complementary magnetic memory cell of the present invention.

FIG. 1 is a structural view of the complementary magnetic memory cell of the present invention.

The complementary magnetic memory cell comprises: a heavy metal film or an antiferromagnetic film 1, a first magnetic tunnel junction 11, a second magnetic tunnel junction 12, a first electrode 2, a second electrode 3, a third electrode 4, a fourth electrode 9, and a fifth electrode 10; wherein the first magnetic tunnel junction 11 and the second magnetic tunnel junction 12 are fabricated above the heavy metal film or the antiferromagnetic film 1; the first electrode 2, the second electrode 3 and the third electrode 4 are fabricated under the heavy metal film or the antiferromagnetic film 1; the fourth electrode 9 is fabricated above the first magnetic tunnel junction 11, and the fifth electrode 10 is fabricated above the second magnetic tunnel junction 12.

The first magnetic tunnel junction 11 is formed by four layers, comprising a first ferromagnetic metal 5A, a first oxide 6A, a second ferromagnetic metal 7A, and a first synthetic antiferromagnetic layer 8A. The second magnetic tunnel junction 12 is formed by four layers, comprising a first ferromagnetic metal 5B, a first oxide 6B, a second ferromagnetic metal 7B, and a first synthetic antiferromagnetic layer 8B.

The first magnetic tunnel junction 11 has at least two resistance states, and a resistance value thereof depends on magnetization directions of the first ferromagnetic metal 5A and the second ferromagnetic metal 7A. If the magnetization direction of the first ferromagnetic metal 5A is parallel to that of the second ferromagnetic metal 7A, the resistance value of the first magnetic tunnel junction 11 is small, and the first magnetic tunnel junction 11 is in a low resistance state. On the contrary, if the magnetization directions are anti-parallel, the resistance value of the first magnetic tunnel junction 11 is large, and the first magnetic tunnel junction 11 is in a high resistance state.

The second magnetic tunnel junction 12 has at least two resistance states, and a resistance value thereof depends on magnetization directions of the first ferromagnetic metal 5B and the second ferromagnetic metal 7B. If the magnetization direction of the first ferromagnetic metal 5B is parallel to that of the second ferromagnetic metal 7B, the resistance value of the second magnetic tunnel junction 12 is small, and the second magnetic tunnel junction 12 is in a low resistance state. On the contrary, if the magnetization directions are anti-parallel, the resistance value of the second magnetic tunnel junction 12 is large, and the second magnetic tunnel junction 12 is in a high resistance state.

Preferably, the magnetization directions of the second ferromagnetic metals 7A and 7B are pinned, and the magnetization directions of the first ferromagnetic metals 5A and 5B can be changed by a writing operation.

To store one bit of data, the first magnetic tunnel junction 11 and the second magnetic tunnel junction 12 are arranged in a pair of complementary resistance states. For example, the first magnetic tunnel junction 11 is set to a high resistance state and the second magnetic tunnel junction is set to a low resistance state, and vice versa.

The devices used in the present invention are formed by plating material layers on a substrate in a bottom-top order by conventional molecular beam epitaxy, atomic layer deposition or magnetron sputtering, and then performing conventional nano-device processing technologies such as photolithography and etching.

The device fabrication process used in the present invention is integrated through a conventional semiconductor production backend process.

Preferably, the heavy metal film or the antiferromagnetic film 1 has a thickness of 0 to 20 nm.

Preferably, the heavy metal film or the antiferromagnetic film 1 has a rectangular shape with a top area thereof larger than bottom areas of the first magnetic tunnel junction 11 and the second magnetic tunnel junction 12. Bottom surface shapes of the first magnetic tunnel junction 11 and the second magnetic tunnel junction 12 are completely embedded in a top surface shape of the heavy metal film or the antiferromagnetic film 1.

Preferably, shapes of the first magnetic tunnel junction 11 and the second magnetic tunnel junction 12 are square, rectangular (an aspect ratio may be any value), circular or elliptical (an aspect ratio may be any value).

Preferably, the first ferromagnetic metals 5A and 5B have a thickness of 0 to 3 nm, the first oxides 6A and 6B have a thickness of 0 to 2 nm, the second ferromagnetic metals 7A and 7B have a thickness of 0 to 3 nm, the first synthetic antiferromagnetic layers 8A and 8B have a thickness of 0 to 20 nm, and the first electrode 2, the second electrode 3, the third electrode 4, the fourth electrode 9 and the fifth electrode 10 have a thickness of 10 to 200 nm.

Preferably, the heavy metal film 1 is made of platinum Pt, tantalum Ta or tungsten W.

Preferably, the antiferromagnetic film 1 is made of cerium manganese IrMn or platinum manganese PtMn, and an element ratio in these compounds may be changeable.

Preferably, the first electrode 2 is made of tantalum Ta, aluminum Al or copper Cu.

Preferably, the second electrode 3 is made of tantalum Ta, aluminum Al or copper Cu.

Preferably, the third electrode 4 is made of tantalum Ta, aluminum Al or copper Cu.

Preferably, the fourth electrode 9 is made of tantalum Ta, aluminum Al or copper Cu.

Preferably, the fifth electrode 10 is made of tantalum Ta, aluminum Al or copper Cu.

Preferably, the first ferromagnetic metals 5A and 5B are made of a mixed metal material of cobalt iron CoFe, cobalt iron boron CoFeB or nickel iron NiFe, and an element ratio in the mixed metal material may be changeable.

Preferably, the first oxides 6A and 6B are made of magnesium oxide MgO or aluminum oxide $Al_2O_3$ for generating a tunneling magnetoresistance effect.

Preferably, the second ferromagnetic metals 7A and 7B are made of a mixed metal material of cobalt iron CoFe, cobalt iron boron CoFeB or nickel iron NiFe, and an element ratio in the mixed metal material may be changeable.

Preferably, the first synthetic antiferromagnetic layers 8A and 8B are a mixed layer of tantalum Ta/cobalt platinum multilayer film $[Co/Pt]_n$/ruthenium Ru/cobalt platinum multilayer film $[Co/Pt]_m$, or a mixed layer of tantalum Ta/cobalt palladium multilayer film $[Co/Pd]_n$/ruthenium Ru/cobalt palladium multilayer film $[Co/Pd]_m$, or a mixed layer of ruthenium Ru/cobalt iron CoFe/platinum manganese PtMn, or a mixed layer of ruthenium Ru/cobalt iron boron CoFeB/platinum manganese PtMn, or a mixed layer of ruthenium Ru/cobalt iron CoFe/manganese IrrMn, or a mixed layer of ruthenium Ru/cobalt iron boron CoFeB/tellurium manganese IrMn; which means $Ta/[Co/Pt]_n/Ru/[Co/Pt]_m$, or $Ta/[Co/Pd]_n/Ru/[Co/Pd]_m$, or Ru/CoFe/PtMn, or Ru/CoFeB/PtMn, or Ru/CoFe/IrMn, or Ru/CoFeB/IrMn; wherein an element ratio in the mixed metal material or compound may be changeable, and the layer numbers m and n can be changeable.

Figure 2:
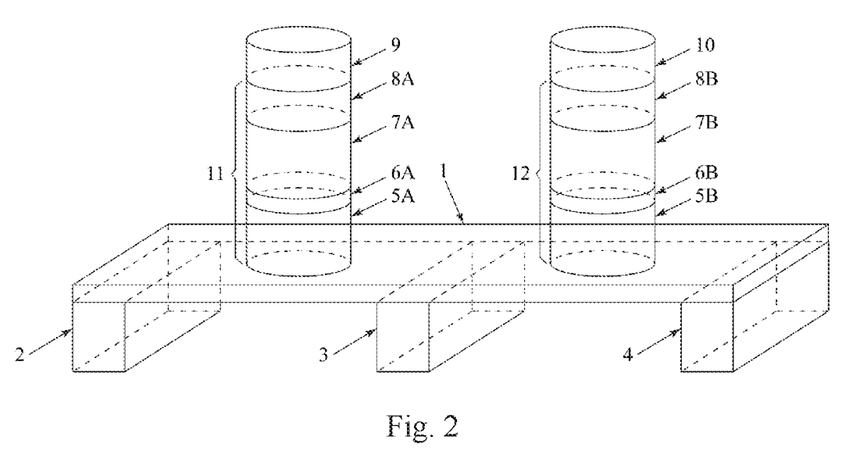
FIG. 2 is a schematic view of the complementary magnetic memory cell according to an embodiment of the present invention. (taking a circular magnetic tunnel junction as an example).

FIG. 2 is a schematic view of the complementary magnetic memory cell according to an embodiment of the present invention.

In the embodiment, the first magnetic tunnel junction 11 and the second magnetic tunnel junction 12 are formed in a circular shape, and the shapes of the first magnetic tunnel junction 11 and the second magnetic tunnel junction 12 may also be square, rectangular (an aspect ratio may be any value) or elliptical (an aspect ratio may be any value); The heavy metal film or the antiferromagnetic film 1 has a rectangular shape with a top area thereof larger than bottom areas of the first magnetic tunnel junction 11 and the second magnetic tunnel junction 12. Bottom surface shapes of the first magnetic tunnel junction 11 and the second magnetic tunnel junction 12 are completely embedded in a top surface shape of the heavy metal film or the antiferromagnetic film 1.

Figure 3A:
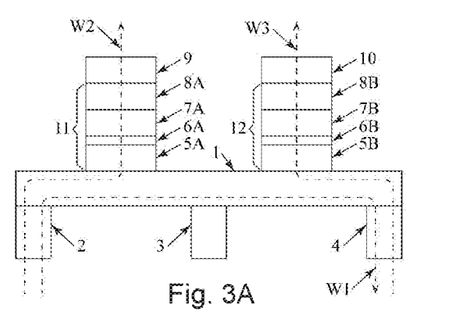
FIGS. 3A-3H are schematic view of a write operation of the complementary magnetic memory cell according to eight alternative embodiments of the present invention.
Figure 3B:
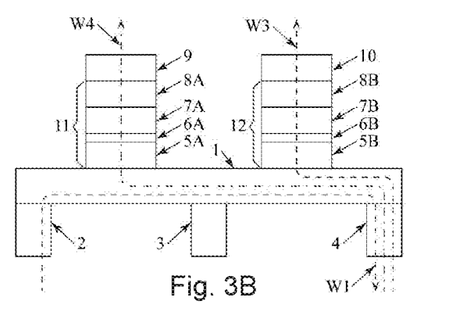
Figure 3C:
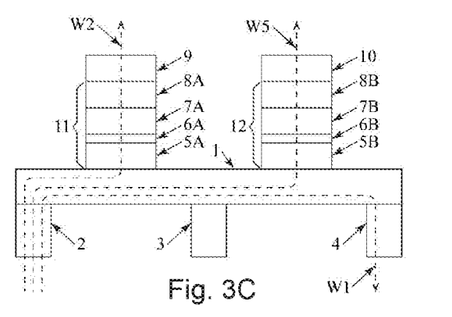
Figure 3D:
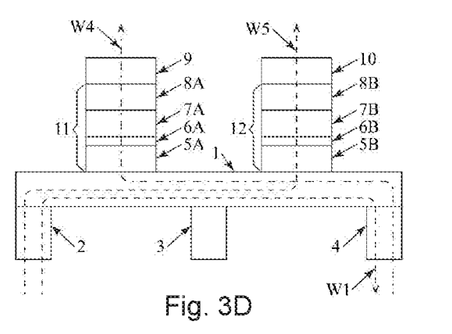
Figure 3E:
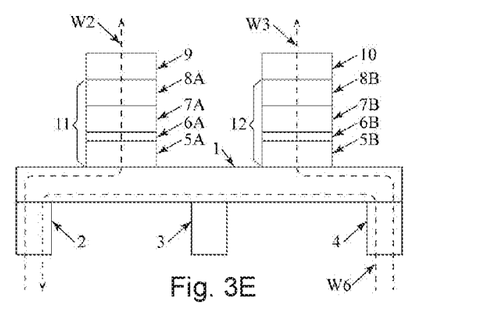
Figure 3F:
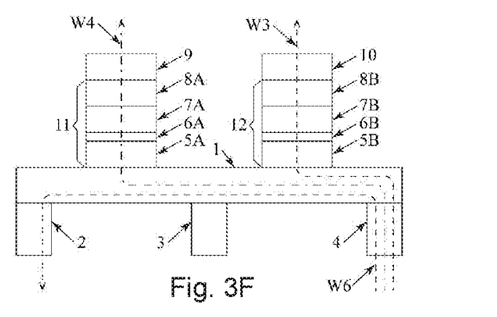
Figure 3G:
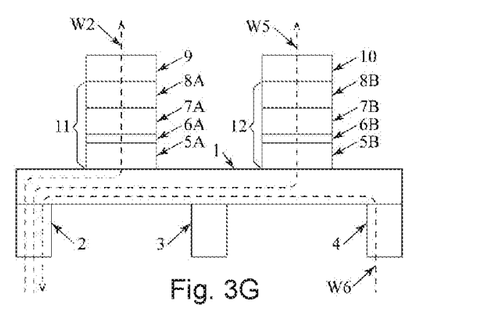
Figure 3H:
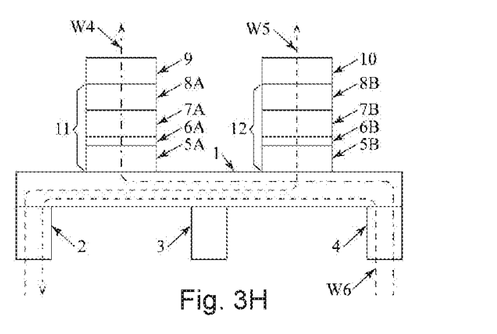

FIGS. 3A-3H are schematic view of a write operation of the complementary magnetic memory cell according to eight alternative embodiments of the present invention. In any of the alternative embodiments, the write operation comprises two steps of:

according to an alternative embodiment as shown in FIG. 3A, step 1) applying a current W1 between the first electrode 2 and the third electrode 4 for generating a spin orbit torque after the current W1 passes through the heavy metal film or the antiferromagnetic film 1; wherein if a value of the current W1 is higher than a threshold current value required for write operation, the first magnetic tunnel junction 11 and the second magnetic tunnel junction 12 are set to a high resistance state; and step 2) according to a state of data to be written, two situations may occur; in a first case, applying a current W2 between the first electrode 2 and the fourth electrode 9 for generating a spin transfer torque after the current W2 passes through the first magnetic tunnel junction 11, wherein if a value of the current W2 is higher than the threshold current value required for the write operation, the first magnetic tunnel junction 11 is set to a low resistance state while the second magnetic tunnel junction 12 is still in the high resistance state; in a second case, applying a current W3 between the third electrode 4 and the fifth electrode 10 for generating a spin transfer torque after the current W3 passes through the second magnetic tunnel junction 12, wherein if a value of the current W3 is higher than the threshold current value required for the write operation, the second magnetic tunnel junction 12 is set to the low resistance state while the first magnetic tunnel junction 11 is still in the high resistance state.

In any of the alternative embodiments shown in FIGS. 3B-3H, principle of the write operation is the same as that of the alternative embodiment shown in FIG. 3A, and one of the alternative embodiments can be selected according to property of the device and data value to be written to complete the write operation. Differences between the various alternatively embodiments shown in FIGS. 3A-3H is that in the step 1) of the write operation, a current flows through the heavy metal film or the antiferromagnetic film 1 may be any one of W1 and W6; and in the step 2) of the data writing operation, a current flows through one of the first magnetic tunnel junction 11 and the second magnetic tunnel junction 12, wherein for the first magnetic tunnel junction 11, the current may be W2 or W4, and for the second magnetic tunnel junction 12, the current may be W3 or W5. Therefore, eight combinations are formed, as shown in FIGS. 3A-3H.

In the alternatively embodiments shown in FIGS. 3A-3H, the write operation sets the first magnetic tunnel junction 11 and the second magnetic tunnel junction 12 to a pair of complementary resistance states, which means one of the magnetic tunnel junctions is set to the high resistance state, and the other is set to the low resistance state.

It can be seen from the alternative embodiments shown in FIGS. 3A-3H that the data writing operation of the complementary magnetic memory cell of the present invention uses one current to induce the spin orbit torque to write the magnetic tunnel junction to the high resistance state, and uses the other current to induce the spin transfer torque to write the magnetic tunnel junction to the low resistance state, wherein one current is only responsible for the write operation of a certain resistance state. In any given write operation scheme, directions of the two currents are fixed. That is to say, both currents are unidirectional.

Figure 4:
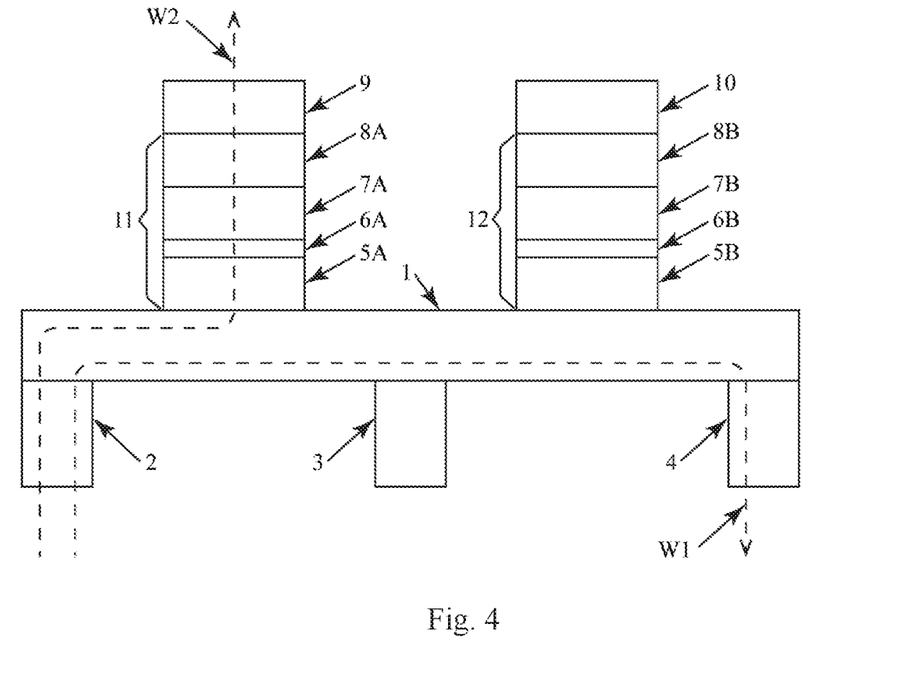
FIG. 4 is a schematic view of the write operation of the complementary magnetic memory cell according to an embodiment of the present invention; in the embodiment, a first magnetic tunnel junction and a second magnetic tunnel junction are respectively set to a high resistance state and a low resistance state.
Figure 5A:
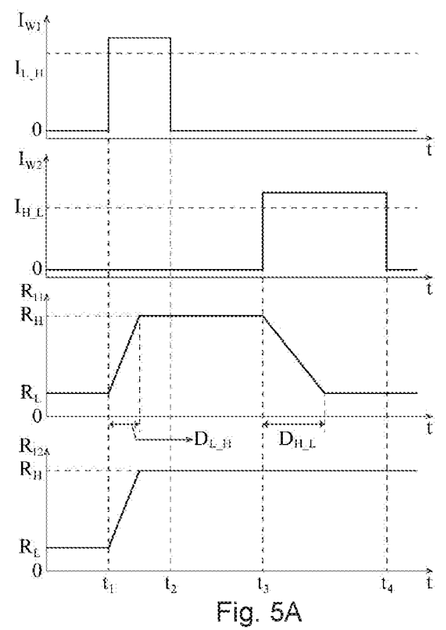
FIGS. 5A-5D are schematic diagrams showing changes in signal waveforms and magnetic tunnel junction resistance states with four possible initial states corresponding to the embodiment of FIG. 4.
Figure 5B:
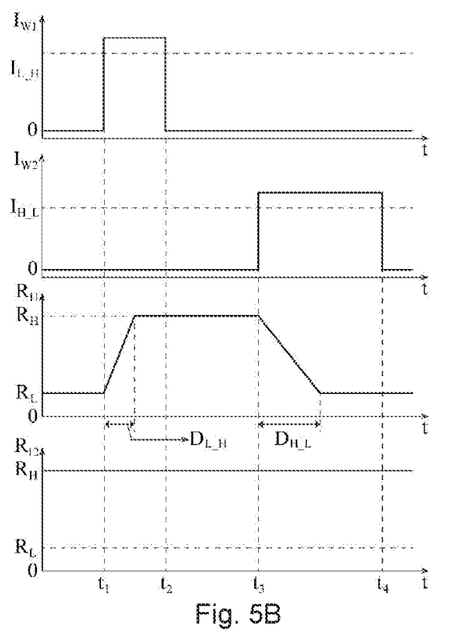
Figure 5C:
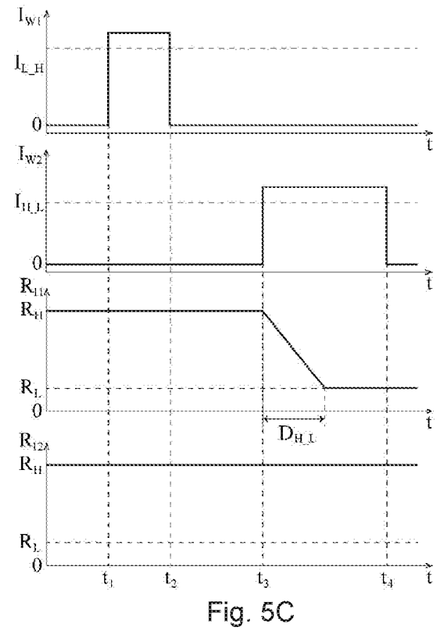
Figure 5D:
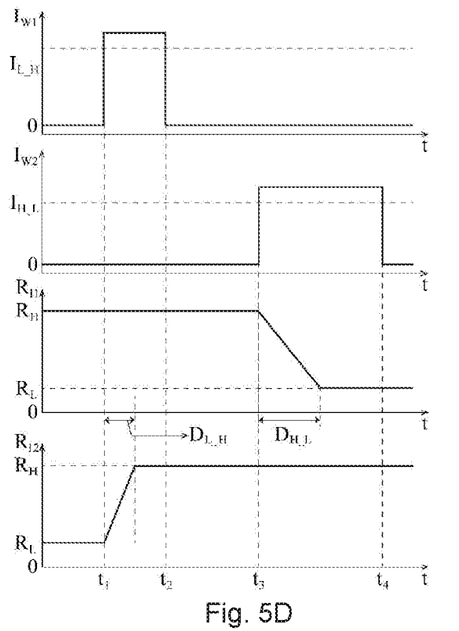

FIG. 4 is a schematic view of the write operation of the complementary magnetic memory cell according to an embodiment of the present invention; in the embodiment, a first magnetic tunnel junction and a second magnetic tunnel junction are respectively set to a high resistance state and a low resistance state. FIGS. 5A-5D are schematic diagrams showing changes in signal waveforms and magnetic tunnel junction resistance states with four possible initial states corresponding to the embodiment of FIG. 4.

In the embodiment shown in FIGS. 4-5, resistance states of the first magnetic tunnel junction 11 and the second magnetic tunnel junction 12 remain unchanged from an initial moment to $t_1$. From time $t_1$ to $t_2$, a current W1 is applied, thereby generating a spin orbit torque, wherein a value $I_{W1}$ of the current W1 is higher than a threshold write current value $I_{L\_H}$, thus the first magnetic tunnel junction 11 and the second magnetic tunnel junction 12 are set to a high resistance state. From $t_2$ to $t_3$, the current W1 is removed, and the resistance states of the first magnetic tunnel junction 11 and the second magnetic tunnel junction 12 remain unchanged. From time $t_3$ to $t_4$, a current W2 is applied, thereby generating a spin transfer torque, wherein a value $I_{W2}$ of the current W2 is higher than a threshold write current value $I_{H\_L}$, thus the first magnetic tunnel junction 11 is set to the low resistance state while the second magnetic tunnel junction 12 remains in the high resistance state. At $t_4$, the current W2 is removed and the write operation is completed. Finally, regardless of the resistance states of the first magnetic tunnel junction 11 and the second magnetic tunnel junction 12 before the write operation, the first magnetic tunnel junction 11 is always set to the low resistance state, and the second magnetic tunnel junction 12 is always set to the high resistance state after the write operation of the embodiment shown in FIGS. 4-5.

Figure 6:
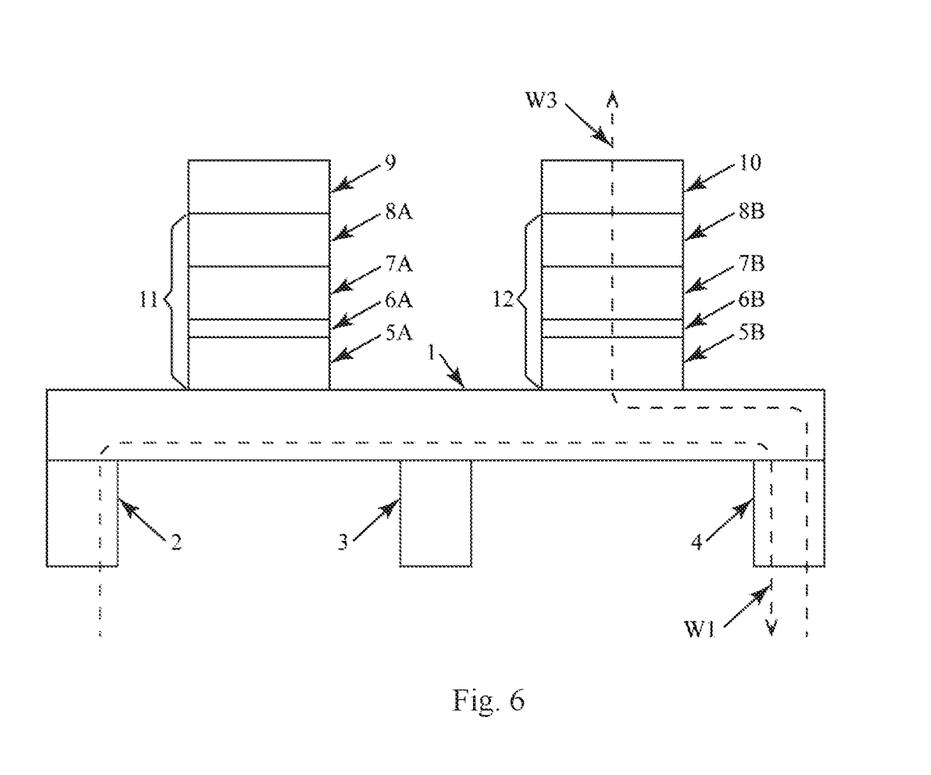
FIG. 6 is a schematic view of the write operation of the complementary magnetic memory cell according to another embodiment of the present invention; in the embodiment, a first magnetic tunnel junction and a second magnetic tunnel junction are respectively set to a low resistance state and a high resistance state.
Figure 7A:
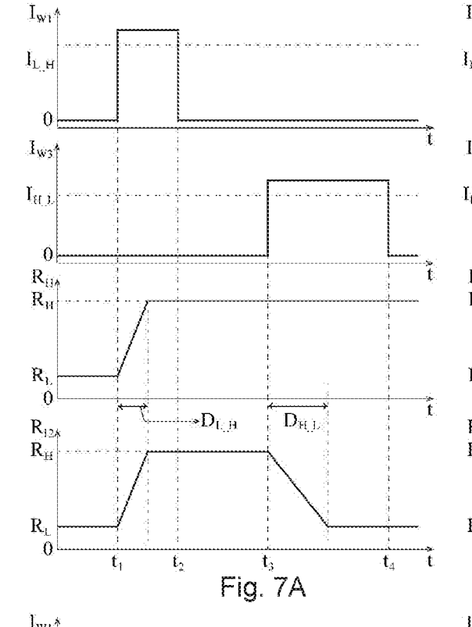
FIGS. 7A-7D are schematic diagrams showing changes in signal waveforms and magnetic tunnel junction resistance states with four possible initial states corresponding to the embodiment of FIG. 6.
Figure 7B:
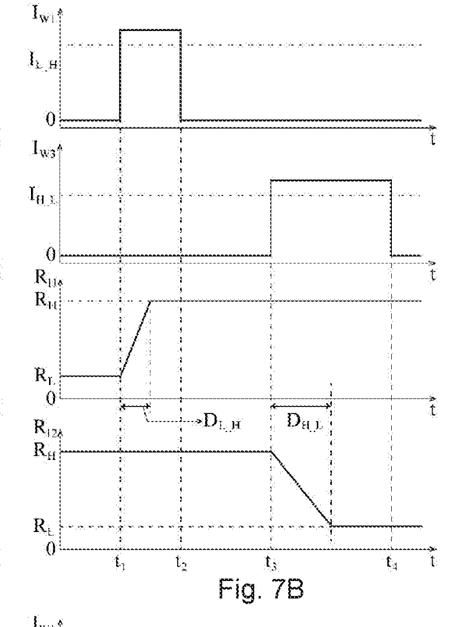
Figure 7C:
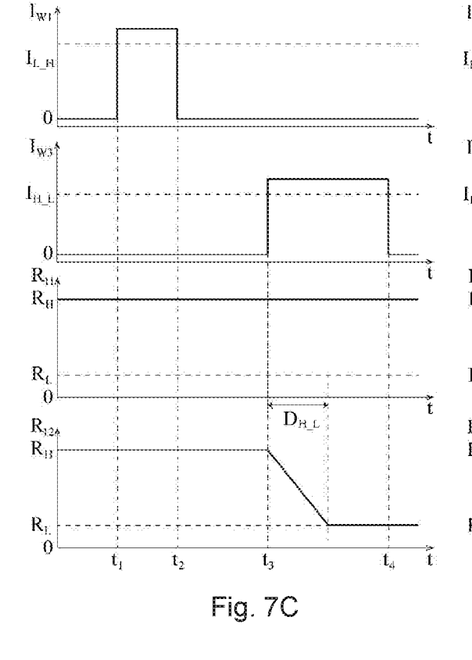
Figure 7D:
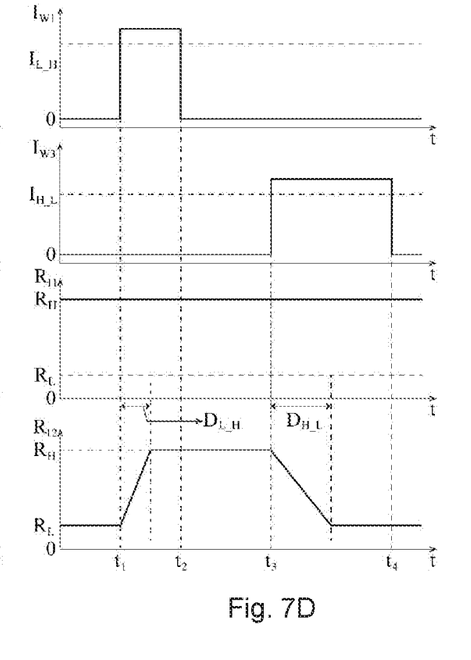

FIG. 6 is a schematic view of the write operation of the complementary magnetic memory cell according to another embodiment of the present invention; in the embodiment, a first magnetic tunnel junction and a second magnetic tunnel junction are respectively set to a low resistance state and a high resistance state. FIGS. 7A-7D are schematic diagrams showing changes in signal waveforms and magnetic tunnel junction resistance states with four possible initial states corresponding to the embodiment of FIG. 6.

In the embodiment shown in FIGS. 6-7, the resistance states of the first magnetic tunnel junction 11 and the second magnetic tunnel junction 12 remain unchanged from an initial moment to $t_1$. From time $t_5$ to $t_6$, a current W1 is applied, thereby generating a spin orbit torque, wherein a value $I_{W1}$ of the current W1 is higher than a threshold write current value $I_{L\_H}$, thus the first magnetic tunnel junction 11 and the second magnetic tunnel junction 12 are set to a high resistance state. From $t_6$ to $t_7$, the current W1 is removed, and the resistance states of the first magnetic tunnel junction 11 and the second magnetic tunnel junction 12 remain unchanged. From time $t_7$ to $t_8$, a current W3 is applied, thereby generating a spin transfer torque, wherein a value $I_{W3}$ of the current W3 is higher than a threshold write current value $I_{H\_L}$, thus the second magnetic tunnel junction 12 is set to the low resistance state while the first magnetic tunnel junction 11 remains in the high resistance state. At $t_8$, the current W3 is removed and the write operation is completed. Finally, regardless of the resistance states of the first magnetic tunnel junction 11 and the second magnetic tunnel junction 12 before the write operation, the first magnetic tunnel junction 11 is always set to the high resistance state, and the second magnetic tunnel junction 12 is always set to the low resistance state after the write operation of the embodiment shown in FIGS. 6-7.

Figure 8:
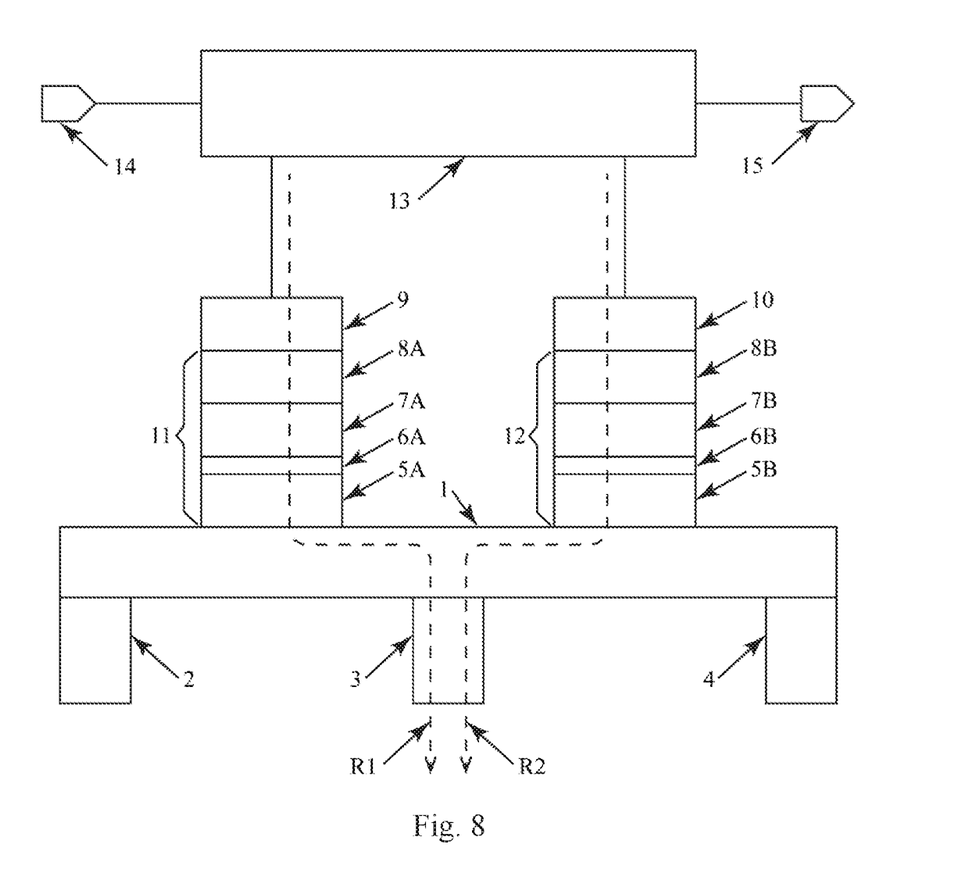
FIG. 8 is a schematic view of a read operation of the complementary magnetic memory cell according to an embodiment of the present invention.
Figure 9A:
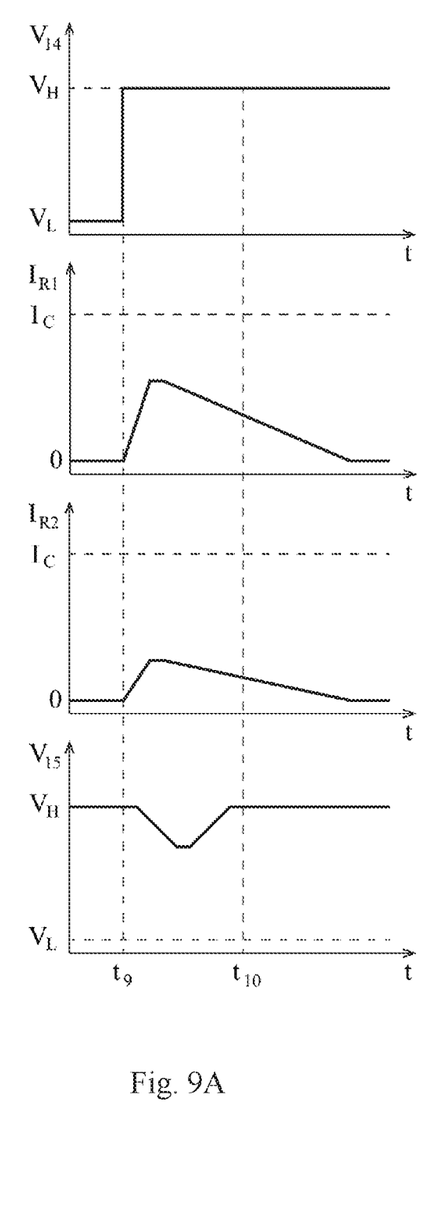
FIGS. 9A-9B are signal waveform diagrams showing with two possible data storage states corresponding to the embodiment of FIG. 8.
Figure 9B:
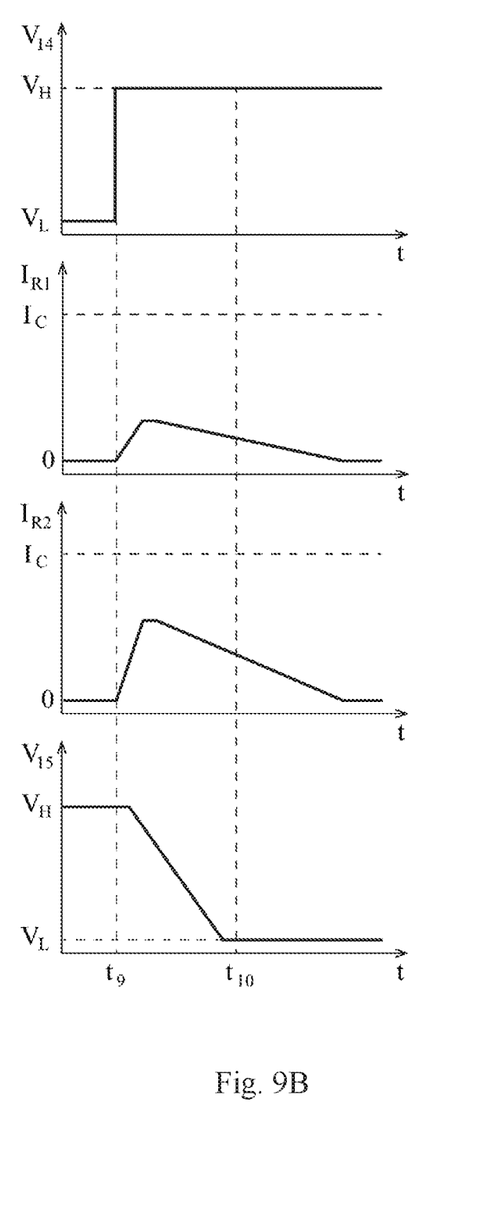

FIG. 8 is a schematic view of a read operation of the complementary magnetic memory cell according to an embodiment of the present invention. FIGS. 9A-9B are signal waveform diagrams showing with two possible data storage states corresponding to the embodiment of FIG. 8.

In the embodiment shown in FIGS. 8-9, from an initial moment to $t_9$, an enable control terminal signal of a read circuit module 13 is set to a logic low level, and the read circuit module 13 is not enabled, wherein no sense current passes through the first magnetic tunnel junction 11 and the second magnetic tunnel junction 12, and an output signal of the read circuit module 13 is always at a logic high level and is independent on the resistance states of the first magnetic tunnel junction 11 and the second magnetic tunnel junction 12. From $t_9$, the enable control terminal signal of the read circuit module 13 is set to a logic high level, and the read circuit module 13 is enabled, wherein sense currents R1 and R2 respectively pass through the first magnetic tunnel junction 11 and the second magnetic tunnel junction 12. Since the first magnetic tunnel junction 11 and the second magnetic tunnel junction 12 have been set to a pair of complementary resistance states by the write operation, a value $I_{R1}$ of the sense current R1 and a value $I_{R2}$ of the sense current R2 are different, and the read circuit module 13 judges a stored data state by comparing $I_{R1}$ and $I_{R2}$. For example, in FIG. 9A, the first magnetic tunnel junction 11 is in the low resistance state, the second magnetic tunnel junction 12 is in the high resistance state, and the value $I_{R1}$ is higher than the value $I_{R2}$. Therefore, the read circuit module 13 determines that stored data represents logic '1', and a result is sent to an output terminal 15 in a form of a logic high level signal at $t_{10}$. It should be understood that $I_{R1}$ and $I_{R2}$ are both lower than a threshold current value $I_C$ required for the write operation, and thus the resistance states of the first magnetic tunnel junction 11 and the second magnetic tunnel junction 12 are not changed. In FIG. 9B, the first magnetic tunnel junction 11 is in the high resistance state, and the second magnetic tunnel junction 12 is in the low resistance state, and the read circuit module 13 uses the principle of FIG. 9A to determine that the stored data represents a logic '0', and a result is sent to the output terminal 15 in a form of a logic low level signal at time $t_{10}$.

It should be understood that the read operation of the complementary magnetic memory cell of the present invention is substantially realized by comparing the resistance values of the first magnetic tunnel junction and the second magnetic tunnel junction. For a specific circuit design, different types of electrical signals can be compared as needed. The embodiment shown in FIGS. 8-9 only takes the current signal as an example. Furthermore, definitions of logic data '0' and '1' depend on the specific circuit structure and application case, and the embodiment shown in FIGS. 8-9 shows only one of the possible definitions.

Figure 10A:
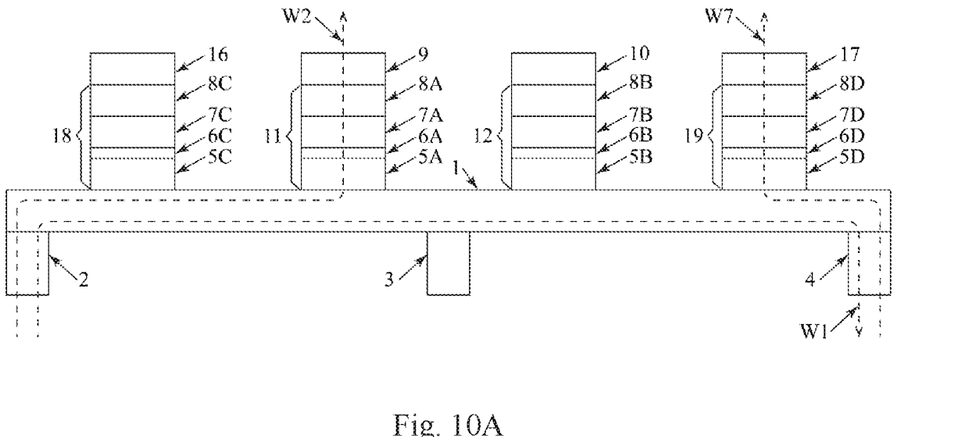
FIGS. 10A-10B are schematic views of the complementary magnetic memory cell according to a modified embodiment of the present invention.
Figure 10B:
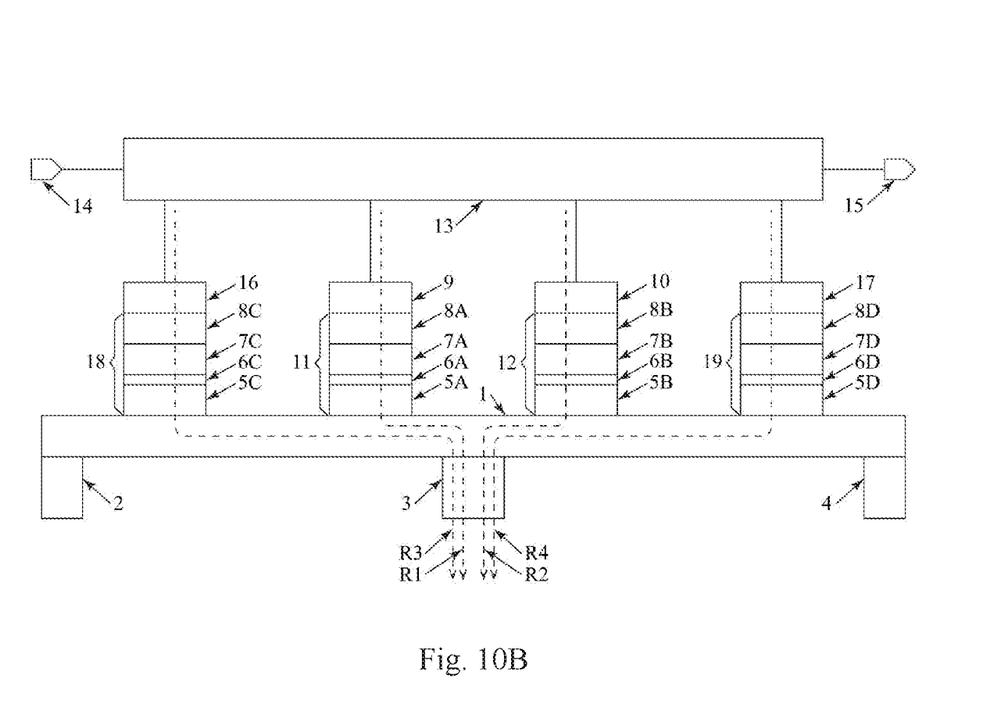

FIGS. 10A-10B are schematic views of the complementary magnetic memory cell according to a modified embodiment of the present invention. Accordingly, a first magnetic tunnel junction 11, a second magnetic tunnel junction 12, a third magnetic tunnel junction 18 and a fourth magnetic tunnel junction 19 are fabricated above a heavy metal film or an antiferromagnetic film 1. To store data, the first magnetic tunnel junction 11 and the second magnetic tunnel junction 12 are arranged in a pair of complementary resistance states for storing one bit of the data, and the third magnetic tunnel junction 18 and the fourth magnetic tunnel junction 19 are arranged in a pair of complementary resistance states for storing another bit of the data. Therefore, the memory cell according to the modified embodiment can store two bits of data.

FIG. 10A is a schematic view of a write operation of the memory unit according to the modified embodiment, a principle thereof is similar to the principle of the embodiment shown in FIGS. 4-7. Step 1), applying a current W1 whose value satisfies $I_{W1}>I_{L\_H}$, wherein the current passes through the heavy metal film or the antiferromagnetic film 1 and generates a spin orbit torque, so as to set the first magnetic tunnel junction 11, the second magnetic tunnel junction 12, the third magnetic tunnel junction 18 and the fourth magnetic tunnel junction 19 to a high resistance state; step 2), applying a current W2 whose value satisfies $I_{W2}>I_{H\_L}$, wherein the current passes through the first magnetic tunnel junction 11 and generates a spin transfer torque, so as to set the first magnetic tunnel junction 11 to a low resistance state; and step 3), applying a current W7 whose value satisfies $I_{W7}>I_{H\_L}$, wherein the current passes through the fourth magnetic tunnel junction 19 and generates a spin transfer torque, so as to set the fourth magnetic tunnel junction 19 to the low resistance state. In some embodiments, the step 2) and the step 3) can be performed simultaneously. Through the above operation, the first magnetic tunnel junction 11 is set to the low resistance state, and the second magnetic tunnel junction 12 is set to the high resistance state to be complementary. At the same time, the third magnetic tunnel junction 18 is set to the high resistance state, and the fourth magnetic tunnel junction 19 is set to the low resistance state to be complementary. Therefore, the memory cell contains two pairs of complementary resistance states capable of storing two bits of data.

FIG. 10B is a schematic view of a read operation of the memory unit according to the modified embodiment, a principle of which is similar to the principle of the embodiment shown in FIGS. 8-9. A reading circuit module 13 compares resistance values of the first magnetic tunnel junction 11 and the second magnetic tunnel junction 12 by sense currents R1 and R2, and transmits a result to an output terminal 15 in a form of a logic level signal. Similarly, the reading circuit module 13 compares resistance values of the third magnetic tunnel junction 18 and the fourth magnetic tunnel junction 19 by sense currents R3 and R4, and transmits a result to the output terminal 15 in the form of the logic level signal. The above two logic level signals represent the stored two bits of data.

Figure 11:
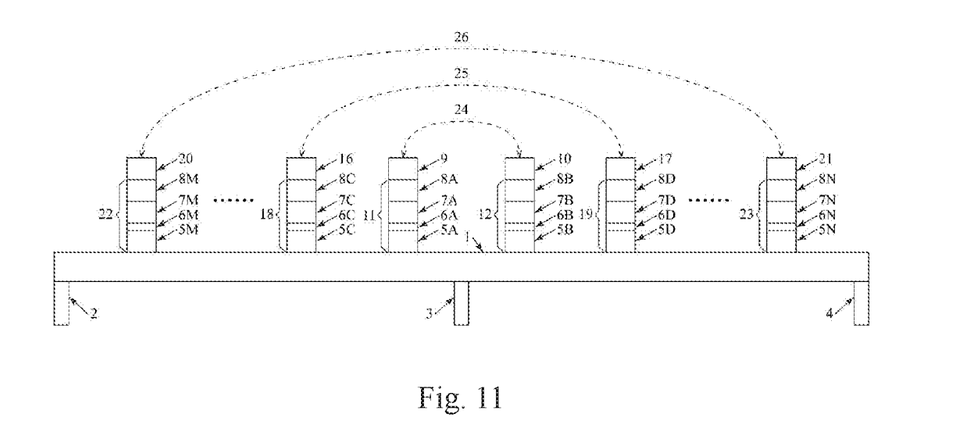
FIG. 11 is a schematic view of the complementary magnetic memory cell according to a modified embodiment of the present invention.

FIG. 11 is a schematic view of the complementary magnetic memory cell according to a modified embodiment of the present invention. A number of the magnetic tunnel junctions above the heavy metal film or the antiferromagnetic film 1 is increased, and thus the data capacity of the memory cell is further expanded. In order to store data, a center point of the heavy metal film or the antiferromagnetic film 1 is taken as an axis of symmetry, and two magnetic tunnel junctions are sequentially taken from both sides of the axis and are set to a pair of complementary resistance states (ie, a pair of magnetic tunnel junctions 24-26). If the magnetic tunnel junction quantity is 2X (X is a positive integer), the complementary magnetic memory cell is capable of storing X bits of data. Accordingly, principles of write operation and read operation are the same as those of the embodiment shown in FIGS. 10A-10B.

What is claimed is:

1. A complementary magnetic memory cell, comprising: a heavy metal film or an antiferromagnetic film, a first magnetic tunnel junction, a second magnetic tunnel junction, a first electrode, a second electrode, a third electrode, a fourth electrode, and a fifth electrode; wherein the first magnetic tunnel junction and the second magnetic tunnel junction are fabricated above the heavy metal film or the antiferromagnetic film; the first electrode, the second electrode and the third electrode are fabricated under the heavy metal film or the antiferromagnetic film; the fourth electrode is fabricated above the first magnetic tunnel junction, and the fifth electrode is fabricated above the second magnetic tunnel junction; to store one bit of data, the first magnetic tunnel junction and the second magnetic tunnel junction are arranged in a pair of complementary resistance states, wherein the first magnetic tunnel junction and the second magnetic tunnel junction are set to a high resistance state by a sufficient current, and then one of the first magnetic tunnel junction and the second magnetic tunnel junction remains at the high resistance state and the other is set to a low resistance state by a spin transfer torque, wherein the first magnetic tunnel junction and the second magnetic tunnel junction are each formed by four layers, consisting of a first ferromagnetic metal, a first oxide, a second ferromagnetic metal, and a first synthetic antiferromagnetic layer.

2. The complementary magnetic memory cell, as recited in claim 1, wherein both the first magnetic tunnel junction and the second magnetic tunnel junction have at least two resistance states, and resistance values thereof depend on magnetization directions of a first ferromagnetic metal and a second ferromagnetic metal.

3. The complementary magnetic memory cell, as recited in claim 1, wherein a magnetic tunnel junction quantity is expandable, so as to expand a data capacity, when the magnetic tunnel junction quantity is 2X and X is a positive integer, the complementary magnetic memory cell is capable of storing X bits of data.

* * * * *